United States Patent [19]
Kosugi

[11] Patent Number: 5,255,158
[45] Date of Patent: Oct. 19, 1993

[54] MICROWAVE CONNECTOR ASSEMBLY CONNECTED EASILY TO MICROWAVE CIRCUIT COMPONENTS

[75] Inventor: Yuhei Kosugi, Tokyo, Japan

[73] Assignee: NEC Corporation, Japan

[21] Appl. No.: 893,723

[22] Filed: Jun. 5, 1992

[30] Foreign Application Priority Data

Jun. 7, 1991 [JP] Japan .................... 3-135204

[51] Int. Cl.⁵ .................................... H05K 7/02
[52] U.S. Cl. .................................... 361/760; 174/52.4; 257/678; 361/730; 361/761; 361/813
[58] Field of Search .......... 361/380, 386–389, 361/392, 394, 395, 399, 400, 401, 415, 420, 421, 424; 174/52.4, 255, 260; 257/678

[56] References Cited

U.S. PATENT DOCUMENTS

| | | | |
|---|---|---|---|
| 3,902,138 | 8/1975 | Hopper, Jr. | 331/98 |
| 4,298,847 | 11/1981 | Hoffman | 333/105 |
| 4,965,542 | 10/1990 | Nelson | 335/5 |
| 5,001,443 | 3/1991 | Martin, III | 333/26 |
| 5,117,330 | 5/1992 | Miazga | 361/400 |

Primary Examiner—Leo P. Picard
Assistant Examiner—Young S. Whang
Attorney, Agent, or Firm—Laff, Whitesel, Conte & Saret

[57] ABSTRACT

A microwave circuit component (40) has terminals and is mounted on a principal surface (38) of a substrate (34) received in a cavity (45) of a housing (35) with a additional surface (39) brought into contact with a bottom surface (44) of the cavity. With a part projected outwardly of the cavity for connection to an external conductor, a contact pin (36) is movably received in an insulator support member (37) placed in the cavity and is urged to one of the terminals. It is possible to bring the principal surface into contact with the bottom surface. In this event, the contact pin may be urged to the additional surface with the terminal extended from the principal surface to the back surface.

8 Claims, 7 Drawing Sheets

MICROWAVE CONNECTOR ASSEMBLY CONNECTED EASILY TO MICROWAVE CIRCUIT COMPONENTS

BACKGROUND OF THE INVENTION

This invention relates to a microwave connector assembly for use in providing electrical connection to terminals of at least one microwave circuit component included in the assembly.

In the manner which will later be described more in detail, a conventional microwave connector assembly comprises two outside terminals which are located outside of a component housing for at least one microwave circuit component and two outside connectors connected to the outside terminals. The conventional microwave connector assembly is bulky. In addition, it is difficult to connect the microwave connector assembly to the microwave circuit component.

SUMMARY OF THE INVENTION

It is therefore an object of this invention to provide a compact microwave connector assembly.

It is another object of this invention to provide a microwave connector assembly which can be easily connected to a microwave component.

It is still another object of this invention to provide a microwave connector assembly which can dispense with a soldering process.

Other objects of this invention will become clear as the description proceeds.

According to an aspect of this invention, there is provided a microwave connector assembly which is for use in electrical connection to terminals of at least one microwave circuit component and which comprises: (A) a substrate having a principal surface on which the above-mentioned at least one microwave circuit component is mounted; (B) a housing having bottom and wall surfaces which define a cavity for receiving the substrate with the substrate brought into contact with the bottom surface; (C) a conductor contact pin connected to one of the terminals and having a part projected outwardly of the cavity for connection to an external conductor; and (D) an insulator support member for supporting the conductor contact pin movable to an away from the substrate.

According to another aspect of this invention, there is provided a microwave connector assembly which is for use in electrical connection to terminals of at least one microwave circuit component and which comprises: (A) a substrate having a principal surface on which the above-mentioned at least one microwave circuit component is mounted and an additional surface on which one of the terminals is laid; (B) a housing having bottom and wall surfaces which define a cavity for receiving said substrate with the additional surface brought into contact with the bottom surface and without the above-mentioned one of the terminals brought into contact with the bottom surface, the housing having an internal surface which defines an installation dent located opposite to the cavity in relation to the substrate and reaching the bottom surface; (C) a conductor contact pin received in the installation dent, connected to the above-mentioned one of the terminals, and having a part projected outwardly of the installation dent for connection to an external conductor; and (D) an insulator support member in the installation dent for supporting the conductor contact pin movable to and away from the substrate.

DESCRIPTION OF THE PREFERRED EMBODIMENTS

Figure 1:
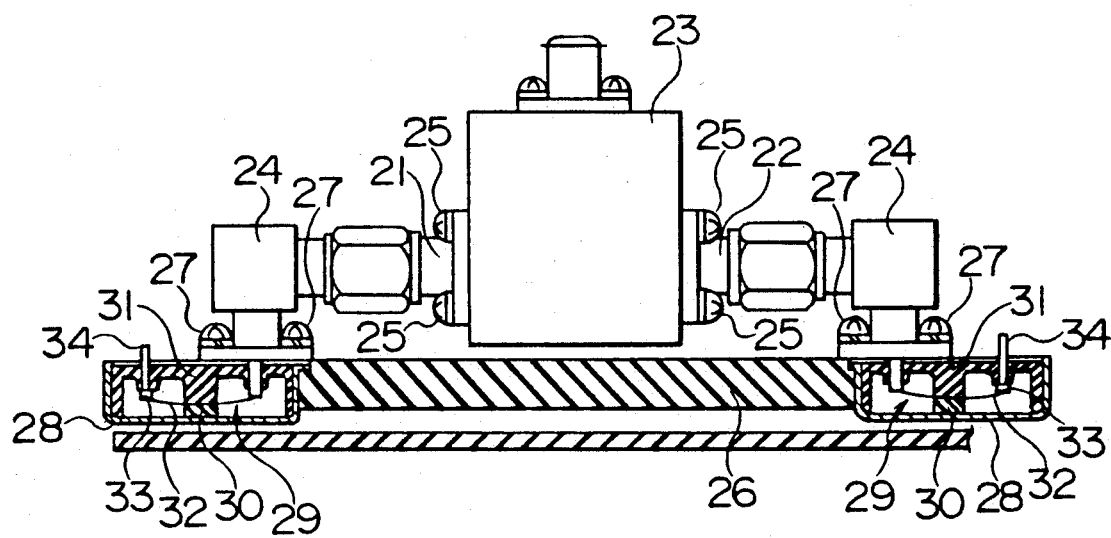
FIG. 1 shows partly in section a side view of a conventional microwave connector assembly.

Referring to FIG. 1, a conventional microwave connector assembly will first be described for a better understanding of this invention. The conventional microwave connector assembly comprises two outside terminals 21 and 22 and two outside connectors 24. The outside terminals 21 and 22 are located outside of a component housing 23 for at least one microwave component (not shown herein). The microwave component is, for example, an isolator. The outside terminals 21 and 22 are fixed to the component housing 23 by screws 25. The outside connectors 24 are fixed on a support plate 26 by screws 27.

The support plate 26 has a plurality of installation holes. Each of the installation holes of the support plate 26 receives a conductive shield case 28. The conductive shield case 28 has bottom and wall surfaces and receives a connector unit 29. The connector unit 29 comprises a lower insulator support 30, an upper insulator support 31, and a center conductor 32. The center conductor 32 is operable as a leaf spring. The center conductor 32 has predetermined length and width, a conductor axis extended along a longitudinal direction, a center area of the longitudinal direction, and a pair of side areas on both sides of the center area along the conductor axis.

The lower insulator support 30 is located on the bottom surface of the conductive shield case 28. The center conductor 32 is interposed between the lower insulator support 30 and the upper insulator support 31. The lower and the upper insulator supports 30 and 31 support the center area of the center conductor 32.

The upper insulator support 30 has first and second holes. A lower part of the outside connector 24 is interposed inside of the conductive shield case 28 through the first hole of the upper insulator support 31. Conductive contacts 33 are interposed inside the conductive shield cases 28, respectively. The conductive contacts 33 are united with radio frequency terminals 34, respectively. Each of the radio frequency terminals 34 is derived from one of microwave components (later shown). The side areas of the center conductor 32 press the outside connector 24 and the conductive contact 33 upwardly of FIG. 1 at a substantially stable contact pressure.

In the conventional microwave connector assembly illustrated in FIG. 1, the outside terminals 21 and 22 and the outside connectors 24 are located outside of the component housing 23 for at least one microwave circuit component and are fixed by the screws 25 and 27. Consequently, the conventional microwave connector assembly is bulky. In addition, it is difficult to contact the microwave connector assembly to the microwave circuit component.

Figure 2:
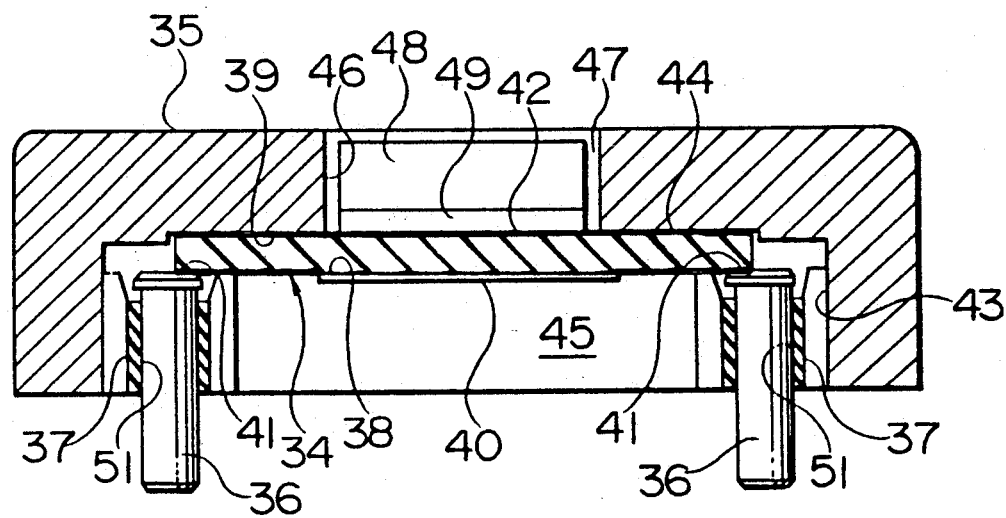
FIG. 2 is a sectional view of a microwave connector assembly according to a first embodiment of this invention.
Figure 3:
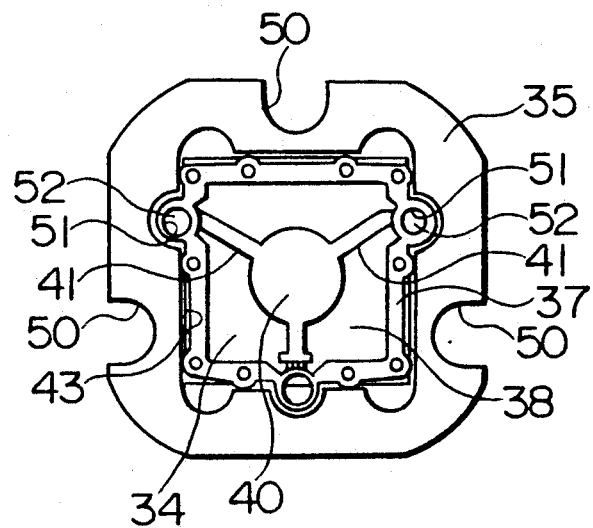
FIG. 3 shows on a reduced scale a bottom view of the microwave connector assembly illustrated in FIG. 2.
Figure 4:
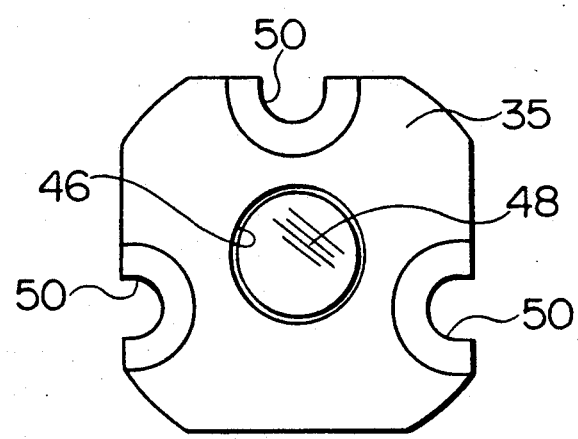
FIG. 4 is a top view of the microwave connector assembly illustrated in FIG. 2.

Turning to FIGS. 2, 3, and 4, the description will proceed to a microwave connector assembly according to a first embodiment of this invention. The illustrated microwave connector assembly comprises a substrate 34, a housing 35, two conductor contact pins 36, and an insulator support member 37.

The substrate 34 has a principal surface 38 and an additional surface 39. In the manner best depicted in FIG. 3, at least one microwave circuit component 40 is mounted on the principal surface 38 of the substrate 34. The microwave circuit component 40 is, for example, an isolator. The microwave circuit component 40 has two terminals 41. The terminals 41 are laid on the principal surface 38. A conductor film 42 (FIG. 1) is laid on the additional surface 39.

The housing 35 is made of a conductive material and has a first wall surface 43 and a bottom surface 44. The first wall and the bottom surfaces 43 and 44 define a first or lower cavity 45. The lower cavity 45 receives the substrate 34 with the conductor film 42 brought into contact with the bottom surface 44. The conductor film 42 may be fixed to the bottom surface 44 by an adhesive. The housing 35 has a second wall surface 46. The second wall surface 46 defines a second or upper cavity 47. The second wall surface 46 reaches the bottom surface 44. The upper cavity 47 receives a magnet 48. The magnet 48 is laid on the conductor film 42 through a spacing member 49. The housing 35 has three ditches 50 outside of the housing 35. Three screws (not shown) are inserted in ditches 50.

The conductor contact pins 36 are connected to the terminals 41. Each of conductor contact pins 36 has an upper part located inside of the lower cavity 45 and a lower part projected outwardly of the lower cavity 45.

The insulator support member 37 comprises a support frame located inside of the lower cavity 45. The insulator support member 37 has two internal wall surfaces 51. Each of the internal wall surfaces 51 defines a support dent 52 for movably receiving the conductor contact pin 36. Namely, the insulator support member 37 supports the conductor contact pins 36 movable to and away from the substrate 34. The insulator support member 37 has a plurality of protrusions outside of the insulator support member 37. The protrusions of the insulator support member 37 are in elastic contact with the wall surface 43.

Figure 5:
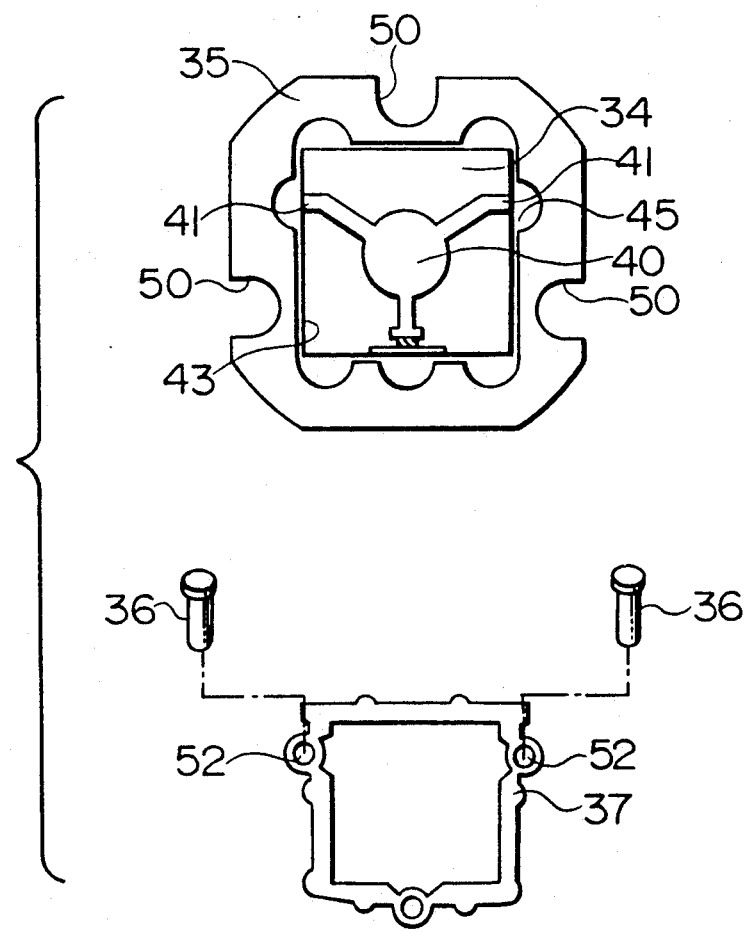
FIG. 5 is an exploded view of the microwave connector assembly illustrated in FIG. 2.

FIG. 5 will be referred to. On assembling the microwave connector assembly, the insulator support member 37 with the conductor contact pins 36 is inserted into the lower cavity 45 of the housing 35 after the substrate 34 is inserted into the lower cavity 45.

Figure 6:
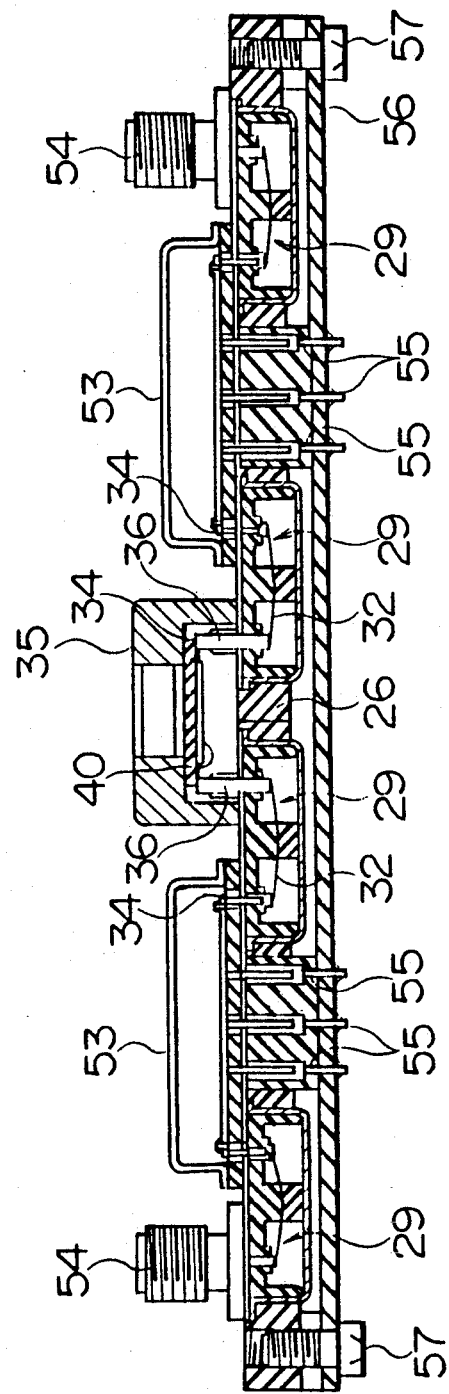
FIG. 6 shows partly in section a side view of the microwave connector assembly illustrated in FIG. 2 and microwave circuit components connected through the microwave connector assembly.

Turning to FIG. 6, the description will proceed to the microwave connector assembly illustrated in FIG. 2 and microwave circuit components connected through the microwave connector assembly. In FIG. 6, the connector unit 29 comprises similar parts designated by like reference numerals. The housing 35 is attached to the support plate 26 by screws (not shown). The lower part of the conductor contact pin 36 is interposed inside of the conductive shield case 28 through the first hole of the upper insulator support 31. The side area of the center conductor 32 presses the conductor contact pin 36 upwardly of FIG. 6 at a substantially constant contact pressure.

Two microwave circuit components 53 are attached to the support plate 26. The microwave circuit components 53 are located on both sides of the housing 35 for the microwave circuit component 40. The microwave circuit component 40 is connected to the microwave circuit components 53 through the microwave connector assembly and the connector unit 29. A pair of connectors 54 are attached to the support plate 26. The connectors 54 are connected to the microwave circuit components 53 through the connector unit 29.

Although each microwave circuit component 54 is operable in response to a microwave signal, each microwave circuit component 54 must often be supplied with a d.c. signal or an intermediate frequency signal having a frequency lower than that of the microwave signal. In other words, a bias circuit or the like should often be connected to the microwave circuit component 54. For this purpose, each of the microwave circuit components 54 has three bias terminals 55.

In the example being illustrated, the bias circuit is formed on a printed circuit board 56 which is independent of the support plate 26 and which is mechanically fastened to the support plate 26 by screws 57. The bias terminals 55 of each microwave component 53 are allowed to pass through holes of the printed circuit board 56 board 56 and are soldered to the printed circuit board 56 to be electrically connected to the bias circuit formed on the printed circuit board 56.

Figure 7:
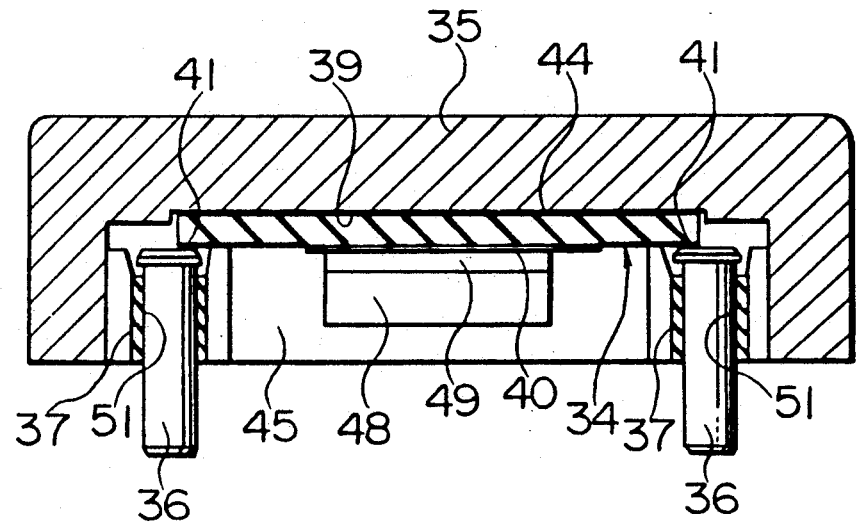
FIG. 7 is a sectional view of a microwave connector assembly according to a second embodiment of this invention.

Referring now to FIG. 7, the description will proceed to a microwave connector assembly according to a second embodiment of this invention. In FIG. 7, the microwave connector assembly comprises similar parts designated by like reference numerals. The magnet 48 is received in the lower cavity 45 rather than the upper cavity 47 described in conjunction with FIG. 2. The magnet 48 is located under the microwave circuit component 40 through the spacing member 49.

Figure 8:
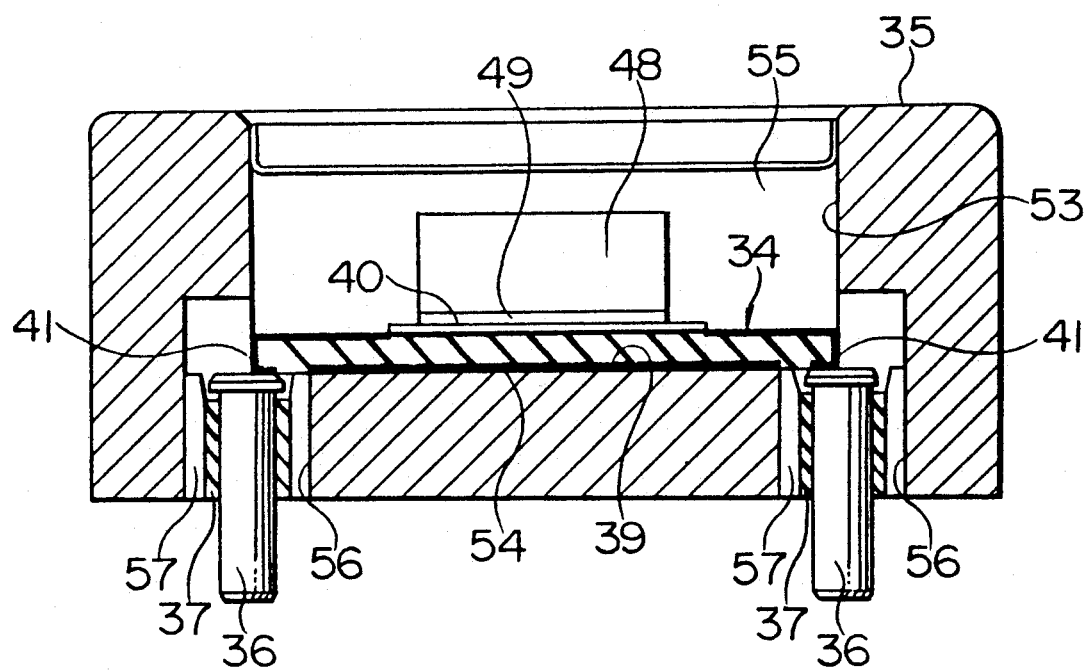
FIG. 8 is a sectional view of a microwave connector assembly according to a third embodiment of this invention.
Figure 9:
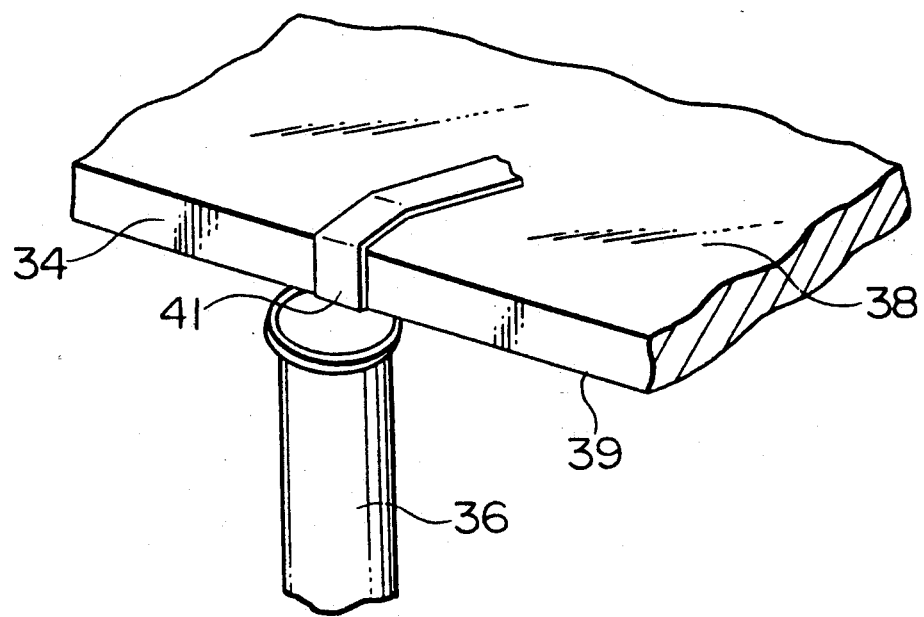
FIG. 9 is a partial perspective view of the microwave connector assembly illustrated in FIG. 8.
Figure 10:
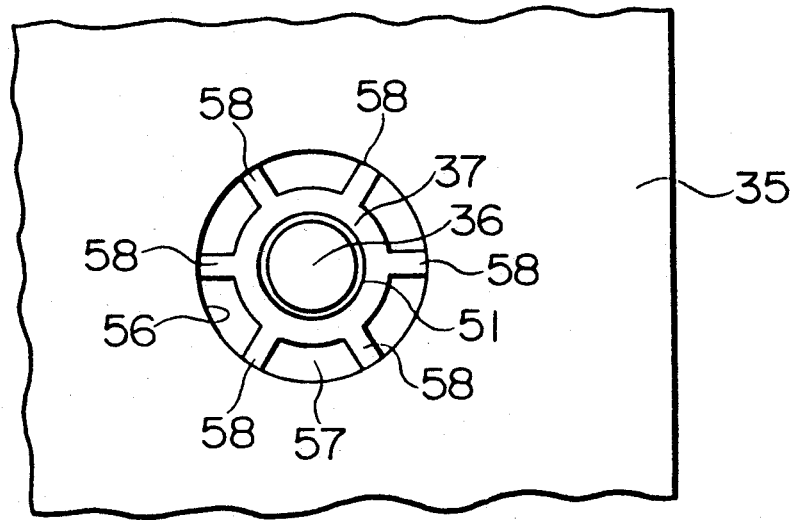
FIG. 10 is a partial bottom view of the microwave connector assembly illustrated in FIG. 8.

Turning to FIGS. 8, 9, and 10, the description will proceed to a microwave connector assembly according to a third embodiment of this invention. In FIGS. 8, 9, and 10, the microwave connector assembly comprises similar parts designated by like reference numerals. The housing 35 has wall and bottom surfaces 53 and 54. The wall and the bottom surfaces 53 and 54 define an upper cavity 55. The upper cavity 55 receives the substrate 34 with the conductor film 39 brought into contact with the bottom surface 54. The upper cavity 55 receives the magnet 48. The magnet 48 is laid on the microwave circuit component 40 through the spacing member 48.

The housing 35 has two internal surfaces 56. Each of the internal surfaces 56 defines an installation dent or through-hole 57. The installation dent 57 is located opposite to the upper cavity 50 and reaches the bottom surface 54.

Each of the terminals 41 is extended to the additional surface 39 from the principal surface 38 (FIG. 9). As a result, a lower part of the terminal 41 is laid to the additional surface 39. The terminals 41 are not brought into contact with the bottom surface 54. The conductor contact pin 36 has an upper part located in the installation dent 57 and a lower part projected outwardly of the installation dent 57. The conductor contact pin 36 is connected to the lower part of the terminal 41.

The insulator support member 37 is located in the installation dent 57. The insulator support member 37 has a plurality of support protrusions 58 outside of the insulator support member 37 (FIG. 10). The support protrusions 58 are in elastic contact with the internal surface 56. With this structure, the insulator support member 37 has a thin thickness.

Figure 11:
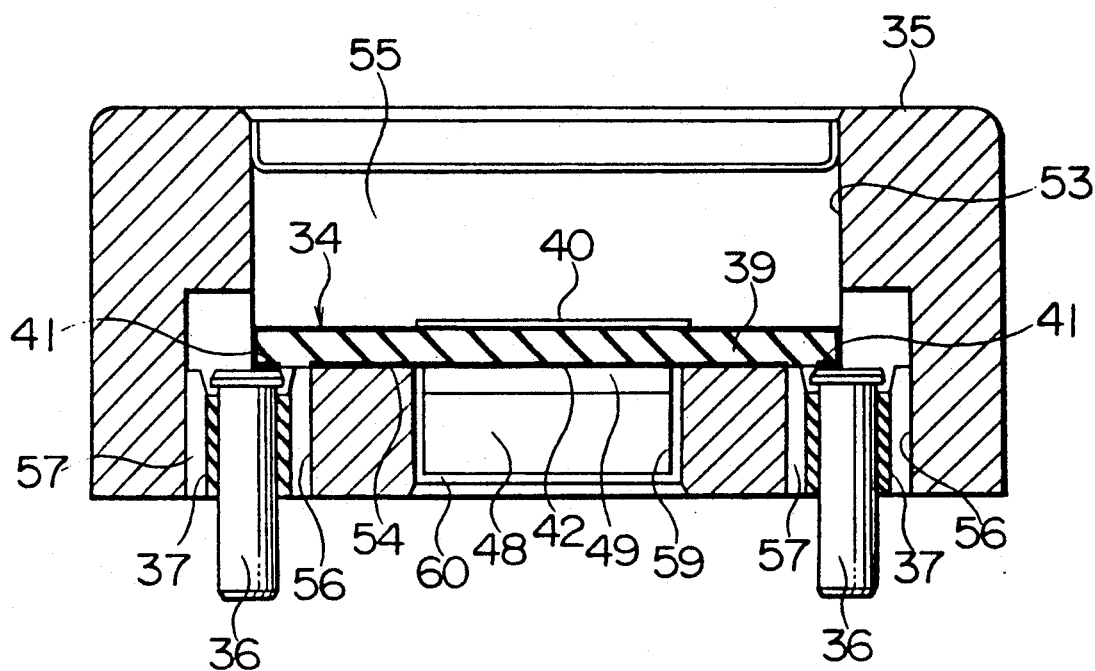
FIG. 11 is a sectional view of a microwave connector assembly according to a fourth embodiment of this invention.

Turning to FIG. 11, the description will proceed to a microwave connector assembly according to a fourth embodiment of this invention. In FIG. 11, the microwave connector assembly comprises similar parts designated by like reference numerals. The housing 35 further has an additional wall surface 59 inside the first-mentioned wall surface 56. The additional wall surface 59 defines a lower cavity 60. The lower cavity 60 receives the magnet 48. The magnet 48 is attached to the conductor film 42 through the spacing member 49.

What is claimed is:

1. A microwave connector assembly for use in electrical connection to terminals of at least one microwave circuit component, said microwave connector assembly comprising:
    a substrate having a principal surface on which said at least one microwave circuit component is mounted;
    a housing having bottom and wall surfaces which define a cavity for receiving said substrate with said substrate brought into contact with said bottom surface;
    a conductor contact pin connected to one of said terminals and having a part projected outwardly of said cavity for connection to an external conductor; and
    an insulator support member for supporting said conductor contact pin movable to and away from said substrate.

2. The microwave connector assembly as claimed in claim 1, wherein said substrate further has an additional surface on which a conductor film is laid and brought into contact with said bottom surface.

3. The microwave connector assembly as claimed in claim 1, wherein said housing is a member made of a conductive material and has said bottom and said wall surfaces.

4. The microwave connector assembly as claimed in claim 1, wherein said insulator support member has an internal wall surface which defines a support dent for movably receiving said conductor contact pin.

5. A microwave connector assembly for use in electrical connection to terminals of at least one microwave circuit component, said microwave connector assembly comprising:
    a substrate having a principal surface on which said at least one microwave circuit component is mounted and an additional surface on which one of said terminals is laid;
    a housing having bottom and wall surfaces which define a cavity for receiving said substrate with said additional surface brought into contact with said bottom surface and without said one of the terminals brought into contact with said bottom surface, said housing having an internal surface which defines an installation dent located opposite to said cavity in relation to said substrate and reaching said bottom surface;
    a conductor contact pin received in said installation dent, connected to said one of the terminals, and having a part projected outwardly of said installation dent for connection to an external conductor; and
    an insulator support member in said installation dent for supporting said conductor contact pin movable to and away from said substrate.

6. The microwave connector assembly as claimed in claim 5, wherein said substrate further has an additional surface on which a conductor film is laid and brought into contact with said bottom surface.

7. The microwave connector assembly as claimed in claim 5, wherein said housing is a member made of a conductor material and has said bottom and said wall surfaces.

8. The microwave connector assembly as claimed in claim 5, wherein said insulator support member has an internal wall surface which defines a support dent for movably receiving said conductor contact pin.

* * * * *